United States Patent
Shuttleworth

(10) Patent No.: US 10,008,998 B2
(45) Date of Patent: Jun. 26, 2018

(54) METHOD, APPARATUS, AND SYSTEM FOR ANALYSIS, EVALUATION, MEASUREMENT AND CONTROL OF AUDIO DYNAMICS PROCESSING

(71) Applicant: Timothy Shuttleworth, Oceanside, CA (US)

(72) Inventor: Timothy Shuttleworth, Oceanside, CA (US)

( * ) Notice: Subject to any disclaimer, the term of this patent is extended or adjusted under 35 U.S.C. 154(b) by 649 days.

(21) Appl. No.: 14/095,951

(22) Filed: Dec. 3, 2013

(65) Prior Publication Data

US 2015/0155842 A1 Jun. 4, 2015

(51) Int. Cl.
*H03G 7/00* (2006.01)
*H03G 11/04* (2006.01)
*H03G 9/00* (2006.01)
*H03G 9/02* (2006.01)
*H04R 29/00* (2006.01)

(52) U.S. Cl.
CPC ............. *H03G 7/002* (2013.01); *H03G 7/007* (2013.01); *H03G 9/005* (2013.01); *H03G 9/025* (2013.01); *H03G 11/04* (2013.01); *H04R 29/001* (2013.01)

(58) Field of Classification Search
CPC ........ H03G 7/002; H03G 7/007; H03G 9/025; H03G 9/005; H03G 11/04; H04R 29/001
See application file for complete search history.

(56) References Cited

U.S. PATENT DOCUMENTS

| | | | |
|---|---|---|---|
| 8,816,886 B1 * | 8/2014 | Warner | H03M 1/1057 341/120 |
| 2014/0340252 A1 * | 11/2014 | Shrivastava | H03M 1/12 341/155 |

* cited by examiner

*Primary Examiner* — Ping Lee
(74) *Attorney, Agent, or Firm* — Heed Law Group; Thomas P. Heed

(57) ABSTRACT

A method, apparatus, and system for measuring and analyzing the effects of dynamics modifying processors on a signal. This new approach utilizes statistical analysis techniques to provide a direct comparison and evaluation between the processed signal and the unprocessed signal's dynamic characteristics. The method identifies and quantifies Effective Dynamic Range, Clip Tolerance, Lower Limit Tolerance, Crest Factor, and Diminuendo Factor, using either peak or r.m.s values. In an alternative embodiment, the invention allows for user adjustment and control of the relative relationship of Crest Factor and Diminuendo Factor, which the user may perceive as loudness.

11 Claims, 13 Drawing Sheets

METHOD, APPARATUS, AND SYSTEM FOR ANALYSIS, EVALUATION, MEASUREMENT AND CONTROL OF AUDIO DYNAMICS PROCESSING

FIELD OF INVENTION

Generally, this invention relates to the class of inventions known as Electrical Audio Signal Processing Systems and Devices. More specifically, this invention belongs to the sub-classes of inventions relating to Monitoring and Measuring of Audio Devices and Amplitude Compression and Expansion.

BACKGROUND OF INVENTION

Audio reproduction has encountered and wrestled with the twin problems of maximizing dynamic range and minimizing compression since the patenting of the electro-dynamic loudspeaker by Peter Jensen in 1927. When addressing the goal of maximum fidelity to the original sound source, audio reproduction systems elements such as amplifiers and loudspeakers must aim to provide a dynamic range which equals or exceeds that of the original source signals. Where the selected available technologies do not allow sufficient dynamic range and linearity to be achieved in the reproduction, system dynamic range is lost either or both at the system minimum capability (the electronics noise floor or minimum motive force in electro-acoustic elements), or at the system maximum capability (clipping or overload). In loudspeakers, system overload can be evident in a lessening of the ratio of output to input as level nears maximum as the system looses linearity such that an increase in input is only partially reflected in an increase in output. This effect in loudspeakers is commonly referred to as power compression. A similar effect, known as signal compression, being a reduction in through gain, the ratio of output to input levels, can be deliberately introduced as a signal processing element in the electronic signal path. This latter technique has been widely used to ameliorate the deleterious effects of reproduction system overload and to allow the source dynamic range to be reduced to allow the signal program material to be reproduced without gross overload of the available sound system. As an example, a typical FM radio transmission may achieve a dynamic range on the order of 50 dB. In contrast, in a typical concert hall with a background noise level of 35 dBA performance levels can reach over 115 dBA, a dynamic range of 80 dB. The performance dynamic range exceeds the dynamic range available for an FM broadcast of the concert by 30 dB. Signal dynamic range compression must be imposed on the source signal to reduce the dynamic range to that available in the reproduction medium. An adjunct dynamic range modifier is an expander which takes the compressed signal and attempts to increase the dynamic range to more closely mimic the original source signal. An audio system that has substantial compression will typically have poor dynamic range. At higher levels, compression becomes objectionable to most listeners, and is a cue that the system performs poorly.

The typical audio amplifier is a voltage-controlled device. A typical audio amplifier will take a small time-varying input voltage (typically 50 mV peak) and will output an identical, though larger, version of the time-varying signal. The overall ratio of the output-to-input is the effective gain of the system, which is often expressed in decibels (dB). When a user increases the volume, they are, in reality, increasing the voltage output from a voltage-controlled amplifier. The voltage-controlled amplifier is limited by its voltage rail, which is, essentially, the output voltage limit. Simplistically stated, if the input times the gain exceeds the voltage rail, the output waveform is going to be distorted.

There are two common methods of addressing the problem of the input times the gain exceeding the voltage rail: clipping or compressing. Clipping refers to the output wave form being flattened anytime the input times the gain exceeds the voltage rail. Compression refers to a control mechanism, within an audio amplifier or processor, that lowers the system gain so that the gain times the input does not exceed the output. Compression is done in real-time in many audio amplifiers, meaning that the gain if varying in real time. As such, Compression is a linear distortion. Although Compression does not affect the Total Harmonic Distortion of a typical audio system, it is, nonetheless, perceptible, and objectionable, to the end-user. Compression is used in almost all audio amplifiers, with clipping being used in only the most inexpensive and lowest performing systems.

Power Compression is an artifact created by the topology and construction of most audio systems. Loudspeakers (the electrical "Load"), be they floor-standing, bookshelf, desktop, or headphone, typically are current-dependent devices, meaning that they follow Lorentz' Force Law: F=Bxli. The force (F), driving the diaphragm, is dependent on the current (i) through a length of wire (I), that is orthogonal to the magnetic field (B).

Since most electric-to-audio transducers follow Lorentz' Law, and since most voltage-controlled amplifiers are limited by a voltage rail, dynamic range and compression become concerns for most audio systems. A useful definition of Dynamic Range is the ratio of the maximum undistorted sine wave to the noise floor, which is the level at which a useful audio signal subsides into the ambient noise of the system. Audio system limitations with respect to Dynamic Range can be measured by Crest Factor. Crest Factor is the ratio between the r.m.s. and the maximum undistorted voltage values in an audio system. From an end-user standpoint, a larger Dynamic Range is preferable. Simultaneously, at a particular listening-level (voltage), a higher Crest Factor is preferable from an end-user standpoint. Diminuendo Factor, or Decrescendo Factor, is defined in this invention as the ratio between the r.m.s. level and noise floor. For a particularly idealized system, the Diminuendo Factor plus Crest Factor, as measured in dB, should equal the Effective Dynamic Range. The Effective Dynamic Range, or the Diminuendo plus Crest Factor, are limited by the voltage rails or by problems inherent in the dynamics processor, itself. The audio volume information can only be presented as voltage variations between the noise floor and the voltage rail, which is the Effective Dynamic Range.

There are many different algorithms for implementing a compression strategy. Mostly, compression uses a limiter circuit, or a DSP which mimics a limiter circuit, and lowers the Crest Factor, so that the Effective Dynamic Range (Diminuendo Factor plus Crest Factor) is within the voltage rails. Since compression, as currently implemented, affects mostly the Crest Factor, and not the Diminuendo Factor, it colors the output of the sound.

Current technology fails to give the listener the ability to control the relative values of compression, Dynamic Range, Diminuendo Factor, and Crest Factor. These values can be measured and quantified as is presented in this system and method. Rather, the current solutions are all concerned with imposing built-in relationships between the compression, Dynamic Range, Diminuendo Factor, and Crest Factor. Furthermore, current technology fails to allow a user to measure and analyze the effects of signal dynamics modifier devices with respect to Effective Dynamic Range, Diminuendo Factor and Crest Factor.

For example, U.S. Pat. No. 8,194,869, by named inventors Ingalls, et. al. ("Ingalls '869"), entitled, "System and method for harmonizing calibration of audio between networked conference rooms," teaches a method a power management system for an audio system in which a processor computes the real time parameters of the loudspeaker in the audio system; a threshold comparator measures the parameters, and compares them versus an estimated operation characteristic; and a limiter which can adjust the audio output signal to the amplifier in real time, according to the operational characteristics. Ingalls '869 teaches a method of varying compression, in real-time, to meet a pre-determined performance criteria. Ingalls '869 is concerned with the load of the system, in other words, the loudspeaker. Ingalls '869 does not teach a method for adjusting the amplifier of an audio system based off of the compression of the system. Furthermore, Ingalls '869 does not teach any method to have the user adjust the parameters of the audio system in order to meet the end-user's preferred settings.

U.S. Pat. No. 7,672,462, by named inventors Yamanashi, et. al. ("Yamanashi '462"), entitled, "Voice/musical sound encoding device and voice/musical sound encoding method," teaches a system and method to protect against acoustic shock. Yamanashi '462 discloses a system comprising a method of receiving an input signal in the time domain and performing pattern analysis of the signal. The pattern analysis includes providing a filterbank with an oversampled signal representation, which a processor transfer. m.s. into a plurality of band signals in the frequency domain. Furthermore, the pattern analysis extracts characteristics, using both a fast average and slow average methodology, in order to arrive at parameters on which to form a decision. Yamanashi '462 does not disclose any methodology which measures compression, Crest Factor, Diminuendo Factor, or Dynamic Range. Additionally, Yamanashi '462 does not include any method or means for an end-user to adjust the audio output.

U.S. Pat. No. 7,583,137, by named inventors Pedersen, et. al. ("Pedersen '137"), entitled, "Power supply compensation," teaches a method of compensating for power supply errors in switching amplifiers. In one embodiment, Pedersen '137 discloses a method of measuring power supply error, creating a compensation signal, and mixing the compensation signal with the input signal. Pedersen '137 does not address variable gain, compression, expansion, or dynamic range. Pedersen '137 does not mention user perception of compression, nor does it allow for user adjustment. Pedersen '137 does not disclose any methodology which measures compression, Crest Factor, Diminuendo Factor, or Dynamic Range. Lastly, Pedersen '137 does not include any method or means for an end-user to adjust the audio output.

U.S. Pat. No. 6,621,338, by named inventor Van Schyndel ("Van Schyndel '338"), entitled, "Gain determination for correlation processes," teaches a method of adjusting the maximum level of voltage given to an electronic device (Load), by adjusting the output level, so that the supplied output voltage exceeds the maximum level of the Load for an amount of time greater than zero. Van Schydel '338 further discloses that the Load can be an analog-to-digital converter. Van Schydel '338 does not disclose any methodology which measures compression, Crest Factor, Diminuendo Factor, Dynamic Range, or user perception. Additionally, Van Schydel '338 does not include any method or means for an end-user to adjust the audio output.

U.S. Pat. No. 4,035,739, by named inventors Dickopp, et. al ("Dickopp '739"), entitled, "Amplifier with variable gain," teaches a method of variable gain control that is frequency dependent, to overcome problems common with compander circuits. Dickopp '739 discloses a circuit for variable gain control in which the lower frequency cut-off is voltage-dependent, so that apparent noise will not be amplitude-modulated by the low-frequency signal energy density. Dickopp '739 does not disclose any methodology which measures compression, Crest Factor, Diminuendo Factor, or Dynamic Range. Additionally, Dickopp '739 does not include any method or means for an end-user to adjust the audio output.

U.S. Pat. No. 8,229,125, by named inventor Short ("Short '125"), entitled, "Adjusting dynamic range of an audio system," teaches an automatic gain control method that has three inputs: output signal dynamic range, maximum output signal level, and minimum output signal level. The user must specify one of the three quantities. The second parameter is determined based off of the first, user-defined, parameter. The input is segmented, in the frequency domain, into frequency bands. The gain is adjusted in each band based off of the first and second parameters. Short '125 does not disclose any method or apparatus which accounts for the users perceptual preference. Furthermore, Short '125 does not disclose any relationship between the compression, Dynamic Range, the Crest Factor, and the Diminuendo Factor, which allows the end user to select the user's preferred point for the values. Lastly, Short '125 does not teach any user viewable measurement or analysis that compares compression, Dynamic Range, the Crest Factor, and the Diminuendo Factor.

U.S. Pat. No. 8,326,444, by named inventors Classen, et. al. ("Classen '444"), entitled, "Method and apparatus for performing audio ducking," teaches a system and method for performing audio ducking between two or more signal. The first signal is analyzed, and its characteristic data, defined as its average level, is maintained for further analysis. A second signal is ducked with the first signal, by adjusting the second signal based on the characteristic data of the first signal. Classen '444 does not disclose any methodology which measures compression, Crest Factor, Diminuendo Factor, or Dynamic Range. Additionally, Classen '444 does not include any method or means for an end-user to adjust the audio output. Classen '444 is concerned solely with ducking two or more signals together based on relative levels.

U.S. Pat. No. 8,300,849, by named inventors Smirnov et. al. ("Smirnov '849"), entitled, "Perceptually weighted digital audio level compression," teaches a digital audio method by taking an input signal; dividing it into frequency blocks; measuring its loudness using a perceptual filter within each block; determining its gain based on target loudness level and measure of loudness within each block; and determining a frequency-dependent gain amount using piecewise linear attack/release logic. Smirnov '849 does not teach a method for user adjustment of compression levels, nor does Smirnov '849 teach a method for determining Crest Factor, Lower Limit Tolerance, Clip Level, and allowing the user to adjust the same.

U.S. Pat. No. 7,848,531, by named inventors Vickers et. al. ("Vickers '531"), entitled, "Method and apparatus for audio loudness and dynamics matching," teaches a method of defining and adjusting apparent loudness. An audio processor, used in conjunction with a compressor, divides the signal into time frames; determines apparent loudness within each time frame; weights the frames to emphasize louder frames, while including contribution of less loud frame; and adjusts the loudness of track based on calculation via nonlinear compression transfer function. Vickers '531 does not teach a user-defined adjustment of compression parameters, such as Crest Factor, Diminuendo Factor, and Clip Tolerance. Neither does Vickers '531 teach any method of comparing a pre- and post-processed dynamics signal.

The current prior art fails to provide a user-adjustable method of setting the level of audio dynamics, such as Effective Dynamic Range, Crest Factor, Diminuendo Factor, and Clip Level. Furthermore, the current prior art fails to provide adequate tools to measure and compare such factors, including a comparison of the input and output of a dynamics modifying device.

SUMMARY OF THE INVENTION

The present invention seeks to overcome the limitations in the prior art, and consists of a novel analysis and measurement technique for the evaluation of processors which modify signal dynamics. This new approach utilizes statistical analysis techniques to provide a direct comparison and evaluation between the processed signal and the unprocessed signal's dynamic characteristics, these characteristics being defined in this document. Implementations of this method include, at a minimum, a DSP or other processor with associated software, a means of collecting data, a means for measuring system dynamics, and a means of adjusting system dynamics. The present invention can be part of a measurement and analysis tool, such as an analyzer; part of an audio system, such as in an integrated audio processor and amplifier; or a stand-alone tool, which can be introduced into the signal chain.

A Probability Density Function shows a histogram of the signal peaks or root means square (r.m.s) values versus a decibel scale, usually with 0 decibels at the far right, and negative decibels being shown going left from the 0 db mark. Digitized time varying signals comprise a series of time-marked absolute values. For example, the well-known Nyquist rule dictates that the rate of sampling of continuous time variant signals must be twice the frequency of the highest frequency of interest. In audio systems this indicates a sampling frequency in excess of twice the highest audible frequency which is considered to be 20 KHz. Hence sampling frequencies of 44.1 KHz and 48 KHz are common. At a sampling rate of 48 KHz, 48,000 data values are captured every second. This means that a three minute musical piece, in digitized form, is represented by approximately 8.64 million data values. This provides a very large database of numerical values ripe for new forms of statistical analysis.

This method addresses the need to measure the effect of a dynamics modifying device on the actual range of levels occurring in the program signal with a recognition of the impact of time considerations such as duration of crescendi and diminuendi, the length of the passage or piece and the duration and nature of extreme levels or peaks. The method is based in analysis of probability densities for a number of characteristics which can be derived from the signal data stream.

In order to fully illustrate the present invention, some technical discussion and definitions are helpful. An inflection point occurs when the sequence of data values in the data stream reverses direction. A signal peak event occurs when the inflection point changes from an increasing sequence to a decreasing sequence. Most often such an inflection point will be a single point of data indicating a momentary peak in the modulus of signal absolute value. Less often several data values in sequence might remain equal during an inflection. This would most commonly occur where the signal is clipped, meaning that the transmission medium's maximum amplitude has been reached or some signal handling or processing algorithm has overrun its data capability. More rarely this may be a natural aspect of the source of the signal such as a musical instrument which creates very high harmonic content. These inflection points represent the edges of the envelope of the signal over time. A collection of the values of all inflection points, or peaks, in a single piece allow a probability density to be computed to represent the range in this envelope over time. See, for example, FIG. 2 which shows an example of a distribution function for signal peaks 111. If the upper extent of the range of inflection point values has a high probability density value 110, this indicates that dynamic range is being lost or constrained by the action of dynamics processing or by limitations in the transmission medium's maximum level capability.

The highest data value in the entire distribution is the highest peak to occur during the passage under examination. However, its probability density may be so low as to render it statistically insignificant. For meaningful measures of the peaks in a passage it is useful to set a minimum probability density and determine the upper limit signal absolute value for that probability density. See, for example, FIG. 9. This computed maximum (peak) value 23, based on the user's set minimum significant probability density 21 can then be used as a reference or benchmark in analysis of all other computed signal data. An additional consideration in setting this reference upper bound is the end-user's tolerance for clipping events in the received signal. In audio listening tests some degree of clipping is well tolerated and often preferred as providing a greater perception of loudness or impact. Hence this selected upper limit will be defined as "Clip Tolerance" or CT expressed as the level corresponding to a selected percentage of the total population of samples which may be clipped without a perceived reduction in information or listener satisfaction and from which a maximum peak level at that Clip Tolerance point is derived.

Computation of root mean square value necessarily involves multiple data points. In time variant signals these multiple data points comprise a sequence of samples occurring in a period of time, a time window (defined here as Tr.m.s.). Short term r.m.s. computations can be accumulated and their probability densities computed to indicate the variation and range in volume loudness through the piece. Choice of the computational time can be varied according to the analytical objective. In audio signals a time constant on the order of the half-period of the lowest frequency of interest is often useful.

As with the case of signal inflection points (peaks), if the upper extent of the range of the short term r.m.s. values has a high probability density value, observable as a truncation of the distribution curve by steep discontinuity, this indicates that dynamic range is being lost or constrained by the action of dynamics processing or by limitations in the transmission medium's maximum level capability. See FIG. 2, showing the upper bound curtailment 110. On the other hand, if the lower extent of the range of short term r.m.s. values has a high probability density value, also observable as a truncation of the distribution curve by a steep discontinuity, this indicates that dynamic range is being lost or constrained by the action of the dynamics processing or by limitations in the transmission medium noise floor. See FIG. 11, showing lower bound curtailment 61.

An additional limit of interest is the lowest level of perceived information the listener or recipient can receive, which is defined as the Lower Limit Tolerance ("LLT"), corresponding to the recipient's noise floor. FIG. 10 shows an r.m.s. signal probability density distribution 118. A user defined minimum significant probability density value 20 is shown, corresponding to the LLT. The intersection of LLT 20 with the probability density distribution 118 provides an r.m.s. level regarded as the lowest level 219 of interest in computing Diminuendo Factor. This level of zero perceived information could be due to subjective factors such as listener preference or physiological factors such as hearing loss or environmental factors such as environmental noise as experienced in moving a car or around industrial machinery.

Where the time window is long, for example over an entire passage or musical piece, the Long Term Root Mean Square ($LT_{r.m.s}$) value will represent the average level throughout the segment, passage or entire musical piece. In this method, the long term r.m.s. time represents the total time segment subject to analysis, whether this is the entirety of a musical piece or a set time window (several seconds typically) allowing the analysis to be repeated continuously during the duration of program material (test signal or music). The upper limit of the $LT_{r.m.s}$ time window is the total time for the complete passage or musical piece's r.m.s. computation denoted $T_{pop}$.

Each of the peak and r.m.s. probability density measurements, computed using the user's set values for CT, LLT, and $LT_{r.m.s}$ can be divided, or filtered, in the frequency domain to provide multiple, frequency-dependent, Probability Density Functions across, the frequency spectrum of the signal analyzed in frequency bands. A passage of music, for example, may have quite different Probability Density Functions in the low-frequency range versus the mid- and the high-frequencies. Analysis and adjustment, using the presently described technique, would then be used to examine and optimize the differences in the effect of the dynamics modifier device across the frequency spectrum. Differences in the degree of dynamics modification across the frequency spectrum are generally perceived as unsatisfactory in listening tests, but are, often, deliberately applied for artificial effects or for system overload protection. As an example low frequencies might be compressed more aggressively than high frequencies as low frequencies tend to have more energy than higher frequencies in natural sounds indicating a greater danger of system overload from lower frequencies. In speech reproduction systems it can be desirable to preserve the inherent dynamics of the middle and higher frequencies to preserve intelligibility while compressing and limiting lower frequencies to avoid overload.

The Probability Density Functions of these parameters, as described above, will typically have the characteristics of a skewed bell curve where the peak of the curve represents the median value. As noted a discontinuity in the form of a curtailment of the skirt of the distribution curve indicates a limitation of the transmission medium: in the case of an upper limitation, a maximum capability of the medium is reached called clipping or overload; and, in the case of a lower limitation the noise floor of the medium is the restriction on the lowest level of usable signal.

The actual Dynamic Range equals the difference between the maximum level and the noise floor. However, the Effective Dynamic Range is the difference between CT and LLT. The present invention includes means for the end-user to set both CT and LLT, allowing, for the first time, the user to define the Effective Dynamic Range. As will be discussed, this has an impact on perceived loudness, also.

Crest factor is commonly defined as the ratio of the maximum peak signal level to the r.m.s. level during a specified time window. Unfortunately the maximum peak signal is poorly defined. Where the maximum attained value occurs only once through the section being analyzed this peak event is not statistically significant and results in a crest factor value of little utility. However, in a time window in which clipping is prevalent, the upper bound of the crest factor will be the voltage rail. The present invention defines a variant of Crest Factor as being the ratio of the CT level (or the system maximum level where upper bound curtailment due to clipping is evident at a level below the CT level) to the median r.m.s. value. We can then further define Diminuendo Factor as the ratio of the median r.m.s. value to the level corresponding to the LLT or the Noise Floor (whichever is higher).

In addition the ratio of the Diminuendo Factor relative to the Crest Factor, which will be referred to as the Relative Loudness, provides an indication of the perceived loudness of the signal program content. Where a dynamics modifier device alters the relationship between Diminuendo Factor and Crest Factor the perceived loudness is affected and alters the listeners experience more than a situation where the Relative Loudness relationship is preserved.

Each probability density function, be that from a population of peak data (inflection points) or short term r.m.s. value computations, can be described in terms of standard statistical terms including, but not limited to, median, average, standard deviation, skew and kurtosis.

This invention is a method to evaluate, and, potentially, adjust, the dynamics modifier devices in terms of their effect on the defined probability distributions, before and after the dynamics modifying device. In essence the method provides ratios of the post-processed and original (input) signal's characteristics such as Effective Dynamic Range, Crest Factor, Diminuendo Factor, Relative Loudness, Median r.m.s. level, Skew and Kurtosis. The operator sets values for Clip Tolerance (CT), Low Level Tolerance (LLT), Short term r.m.s. time window ($T_{r.m.s}$), and Long term r.m.s. time window ($LT_{r.m.s.}$) to enable meaningful ratios to be computed from the post processed and original signal's Probability Density Functions. Additionally, this invention gives the end-user, typically the listener or system-design engineer, the ability to adjust relative levels of Crest Factor and Diminuendo Factor for a given Effective Dynamic Range. This allows the end-user to choose, in more or less a continuous fashion, the perceived Relative Loudness of the system.

Note that for FIGS. 2 through 12 the horizontal axis is signal level in dB and the vertical axis is unscaled probability.

DETAILED DESCRIPTION AND SUMMARY OF THE INVENTION

This description does not limit the invention, but rather illustrates its general principles of operation. Examples are illustrated with the accompanying drawings. A variety of drawings are offered, showing the present invention and the probability density functions that are used in its algorithm.

A Probability Density Function for audio input or output voltage, whether peak or r.m.s., shows a sequence of data values that, ideally, monotonically increase, until a maximum, and then monotonically decrease, until a minimum.

When the sequence of signal absolute value data values in the data stream reverses direction, it indicates an inflection point. When the inflection point in the absolute value changes from an increasing sequence to a decreasing sequence this indicates a signal peak event. Most often, such an inflection point will be a single point of data indicating a momentary peak in the modulus of signal absolute value, but it can also be a sequence of values, when the signal is clipped.

Figure 1:
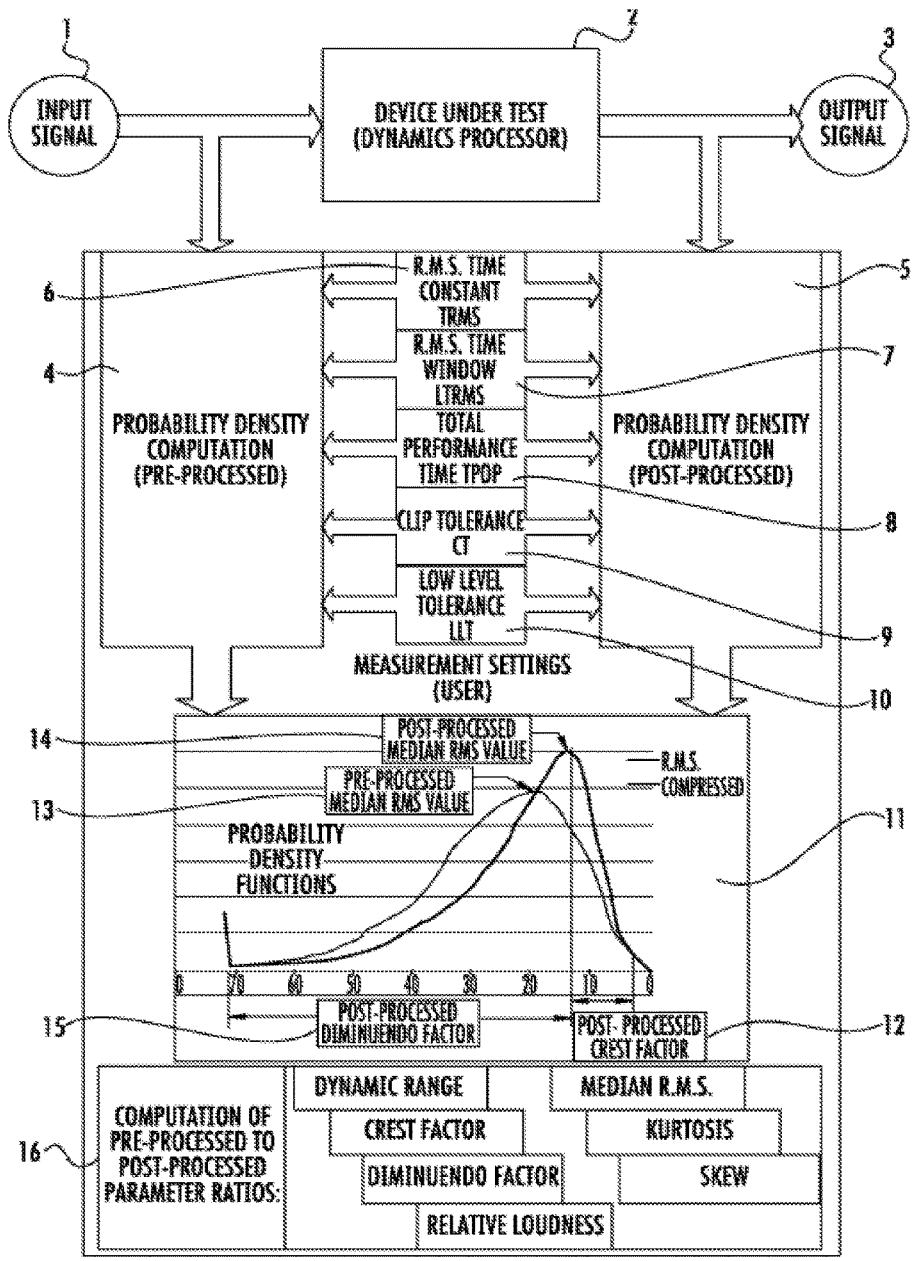
FIG. 1 shows a system architecture diagram of the present invention, using an embodiment that allows user measurement and analysis of a dynamics-modifying device, such as a processor, and the interaction to various pre- and post-processed parameter ratios.

FIG. 1 shows the present invention, along with a probability density analysis chart. The invention relies on an input signal 1. The signal is passed through a dynamics processor 2, which is the device under test ("DUT") 2. The DUT 2 is any device that has a processor that can affect the signal dynamics: compression, expansion, dynamic range, or clipping of a signal. The DUT 2 can include, but is not limited to, a DSP, a signal processor, an integrated amplifier with a DSP that has a compressor, a computer with sound card and software, or an audio system. The DUT 2 outputs an output signal 3. The invention has a processor that can compare the pre-processed probability density 4 of the signal and the post-processed probability density 5 of the signal. The processor can received value settings for root mean square time constant, $T_{rms}$, 6; long-term root mean square time window, $LT_{rms}$, 7; total performance time, $T_{pop}$, 8; Clip Tolerance, CT, 9; and Low Level Tolerance, LLT, 10.

The Probability Density Function pair 11 shows the relationship between a typical pre-processed 13 and post-processed 14 Probability Density Functions. The processor can easily compare the pre-processed 4 and post-processed 5 Probability Density Functions. The processor can assess a number of parameters and ratios 16, between pre- and post-processed values, including, but not limited to, Dynamic Range, Crest Factor, Diminuendo Factor, Relative Loudness, Median r.m.s., Kurtosis, and Skew.

The median value to the noise floor is the Diminuendo Factor 15. In this drawing, the Diminuendo Factor 15 is for the post-processed median r.m.s. value. The post-processed Crest Factor 12 is the CT Level to the median r.m.s. value (corresponding to the peak of the probability density distribution) of the Probability Density Function.

Figure 1B:
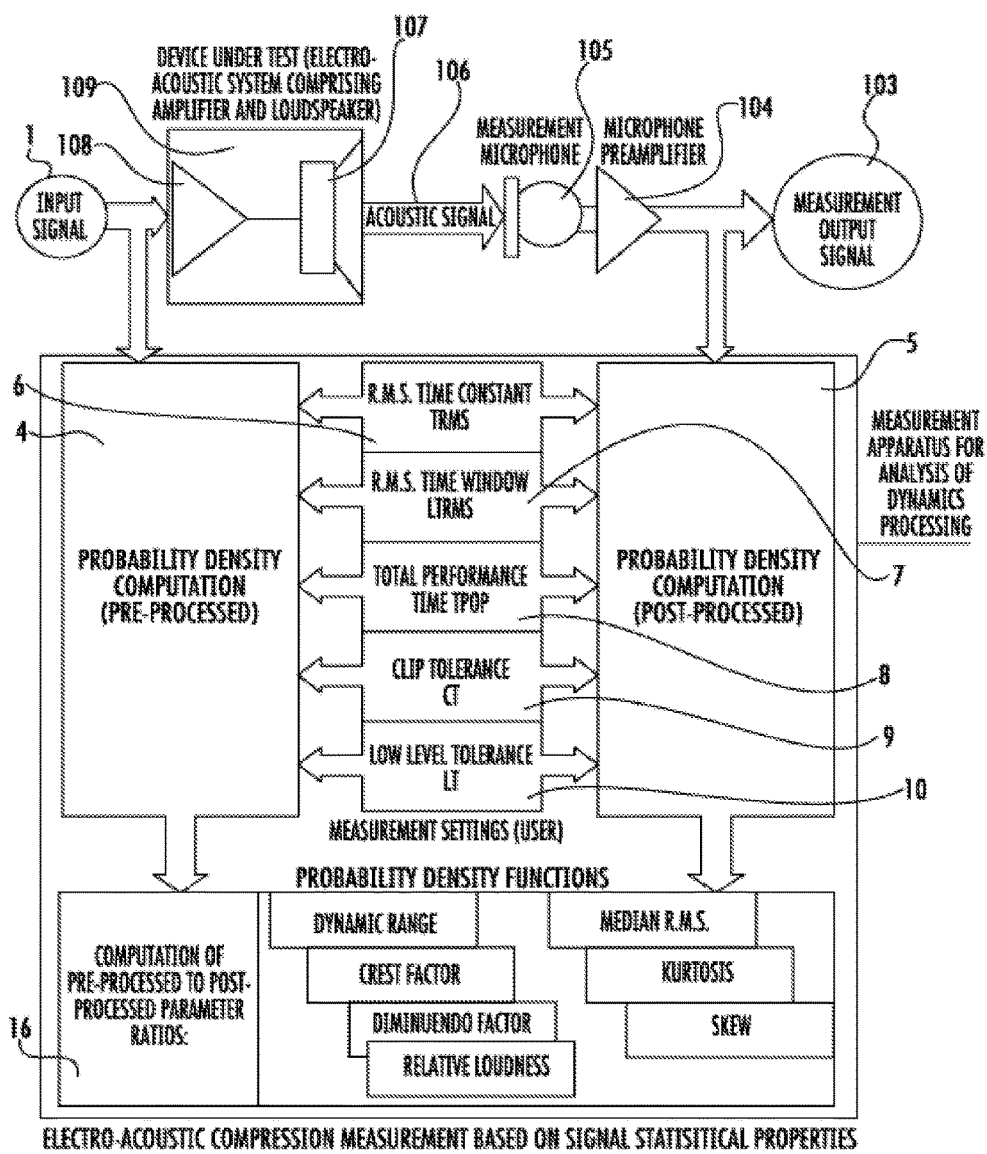
FIG. 1B shows a system architecture diagram of the present invention, using an embodiment that allows the user the ability to measure, analyze, and adjust a dynamics-modifying device, such as a processor, and the parameters and interactions that can be examined and adjusted.

FIG. 1B shows an alternative embodiment for this analysis apparatus used to evaluate the effect of power compression in a loudspeaker system. In this case the output signal 103 is derived from an acoustic signal 106, which is the output of the DUT 109. In this embodiment, the DUT 109 is an electro-acoustic system 109, composed of, at a minimum, an amplifier 108 and a loudspeaker 107. The DUT receives an input 1. A measurement microphone 105 is connected to a measurement preamplifier 104 to provide a signal to the post compression probability density analysis computation 5. The measurement output signal 103 shows the result of such system. Several measurements are consistent between FIG. 1 and FIG. 1B: the pre-processed Probability Density Function 4, $T_{rms}$ 6, LTrms 7, Tpop 8, Clip Tolerance 9 or CT 9, and Low Level Tolerance 10 or LLT 10.

Figure 2:
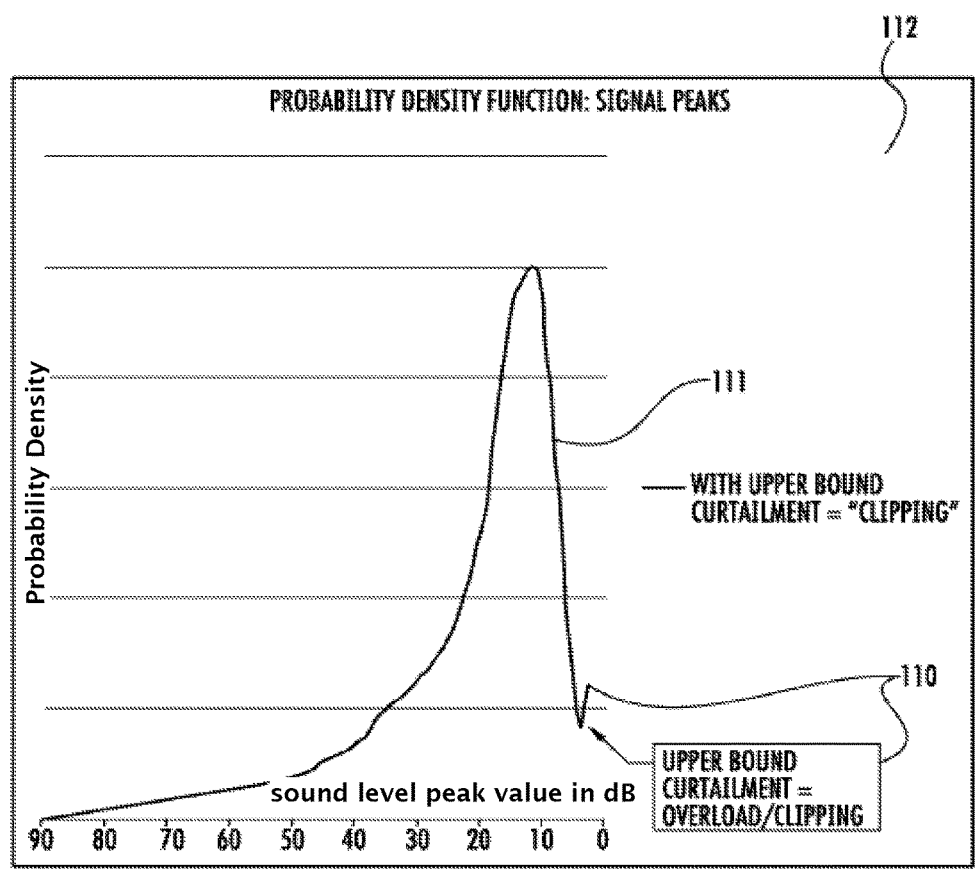
FIG. 2 shows a representative chart or graph of a Probability Density Function of signal peaks with upper bound curtailment.

FIG. 2 shows an example of a Probability Density Function 112 chart for signal peak levels 111 in which the upper level curtailment typical of overload or clipping 110 is evident in a sharp discontinuity in the upper tail of the curve 110. The curve shows a sharp upward discontinuity 110 caused by repeated level events at the system maximum which, absent this level constraint, would occur at higher levels than the level at 110.

Figure 3:
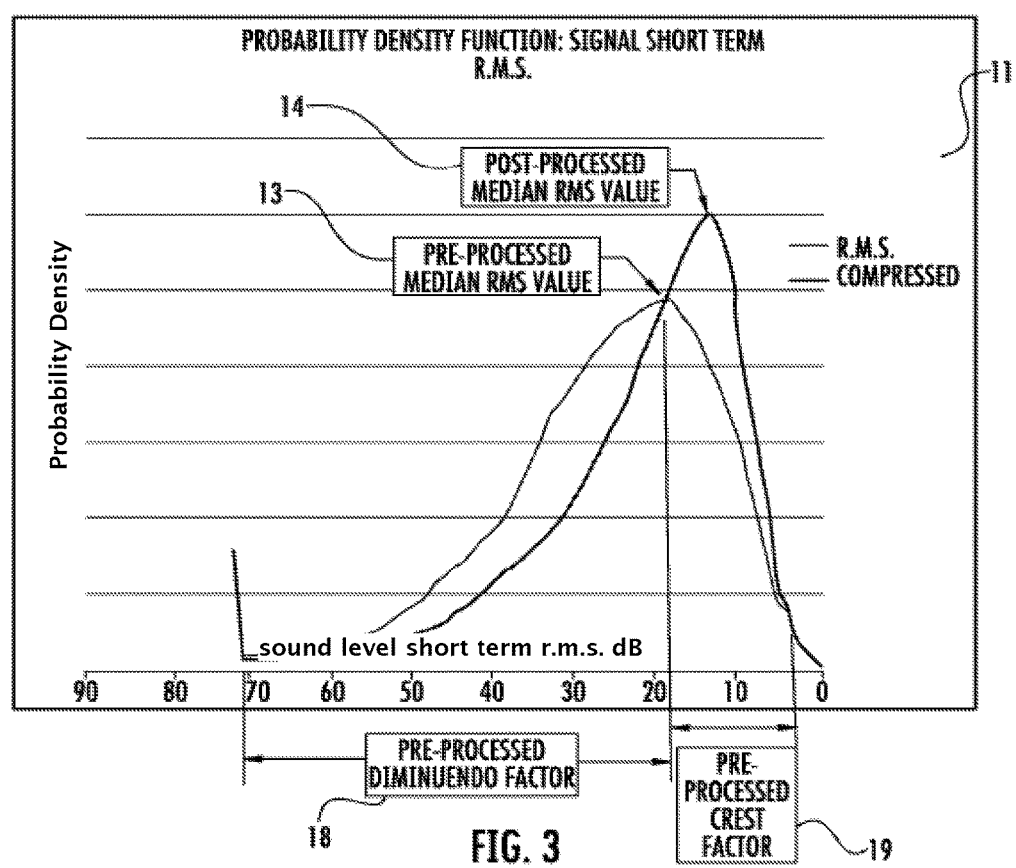
FIG. 3 shows a representative chart or graph of the Probability Density Function of pre- and post-processed median r.m.s. values, taken over $LT_{r.m.s.}$ (or $T_{pop}$, the upper limit of $LT_{r.m.s.}$), and their relationship to pre-processed diminuendo and crest factors.

FIG. 3 shows a graph 11 between pre-13 and post-processed 14 Probability Density Functions 13, 14. The relationship between the pre-processed Diminuendo Factor 18 and pre-processed Crest Factor 19 is illustrated.

Figure 4:
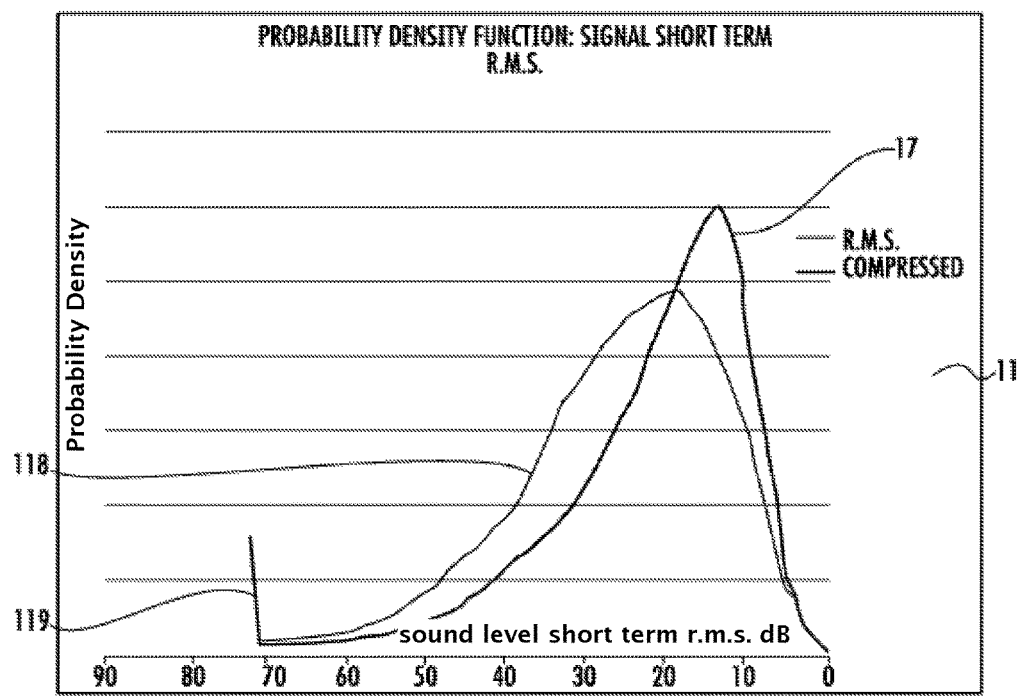
FIG. 4 shows a representative chart or graph of the Probability Density Functions for the original r.m.s. signal voltage and compressed voltage output values, taken over $LT_{r.m.s.}$, in which lower bound curtailment is present.

FIG. 4 shows a Probability Density Function graph 11, comparing the original signal r.m.s. 118 and compressed 17 Probability Density Function. The tail 119 of the original r.m.s. and the compressed 17 curves is shown for an example of lower bound curtailment due system constraints caused by the system noise floor.

Figure 5:
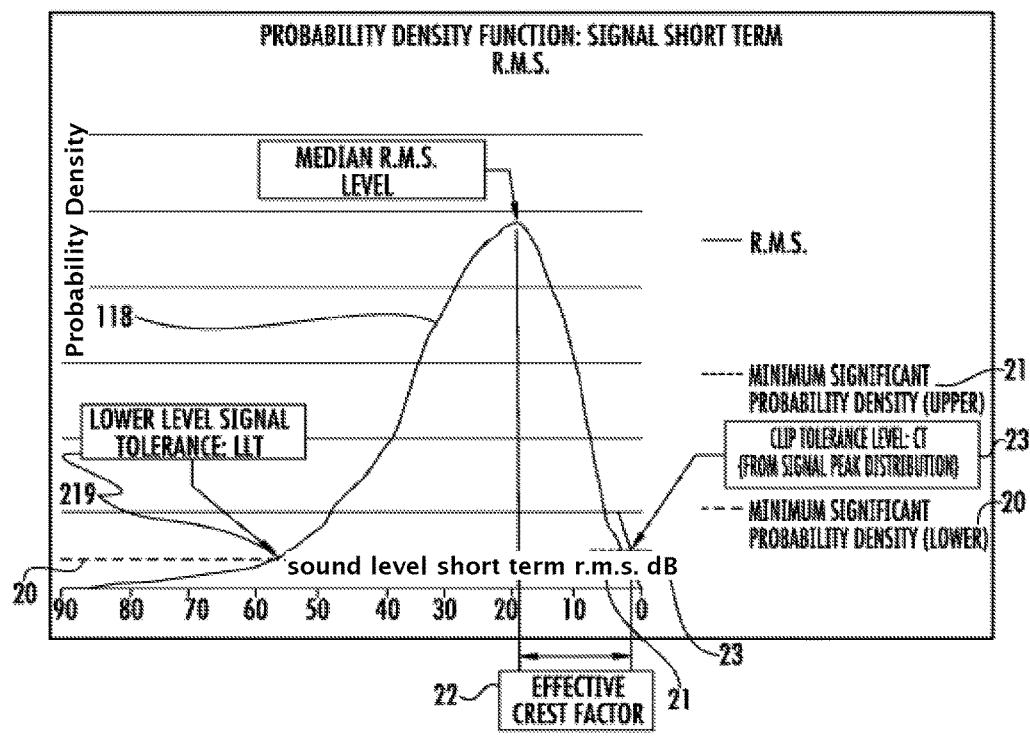
FIG. 5 shows a chart of Probability Density Function for r.m.s. voltage output values, taken over $LT_{r.m.s.}$, and its relationship to LLT, Crest Factor, and Clip Tolerance Level.

FIG. 5 shows an r.m.s. Probability Density Function graph 118, specifically calling out its median level as the peak of the curve. The minimum significant Probability Density Function (upper) 21 defined as Clip Tolerance probability value 23 and minimum significant Probability Density Function (lower) 20 defined as Lower Limit Tolerance probability value 219 are shown. The level at Clip Tolerance 23 is obtained from the intersection of peak level Probability Density Function curve 51 of FIG. 9 and the minimum significant probability density (upper) 21. The Crest Factor 22 is the difference between the Clip Tolerance Level (CT) 23 and the median r.m.s. level (peak of 118). The Lower Level Signal Tolerance (LLT) 219 is the intersection of the r.m.s. Probability Density Function curve 118 and the minimum significant probability density (lower) 20, which is usually considered the noise floor.

Figure 6:
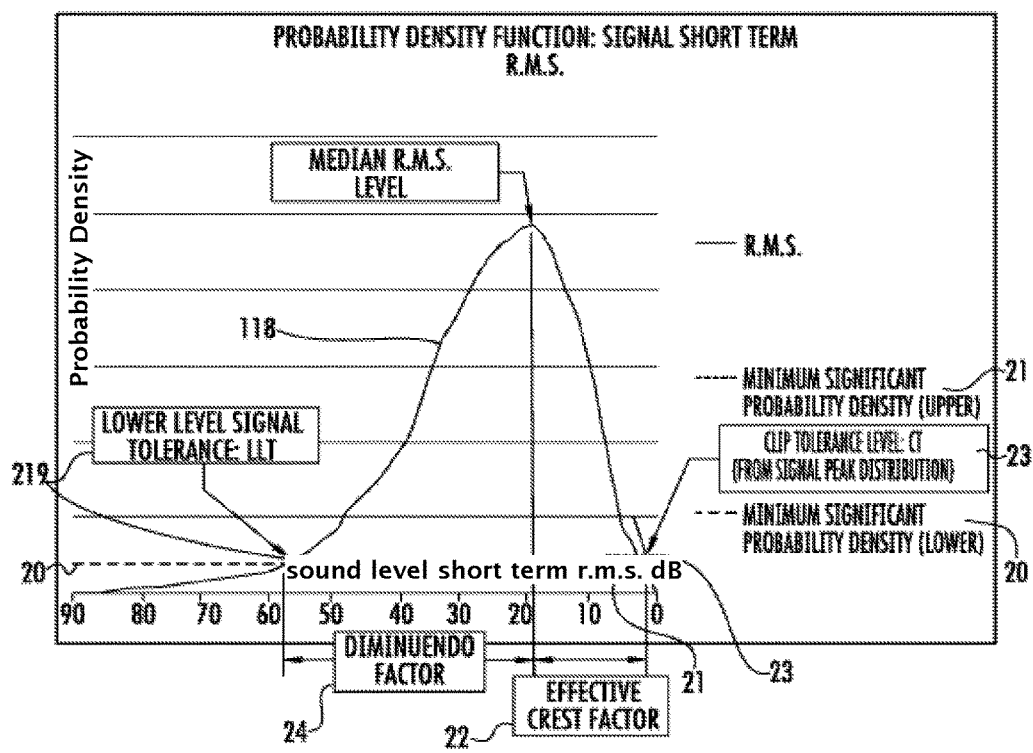
FIG. 6 shows a chart of Probability Density Function for r.m.s. voltage output values, taken over $LT_{r.m.s.}$, and its relationship to Diminuendo Factor and Crest Factor.
Figure 9:
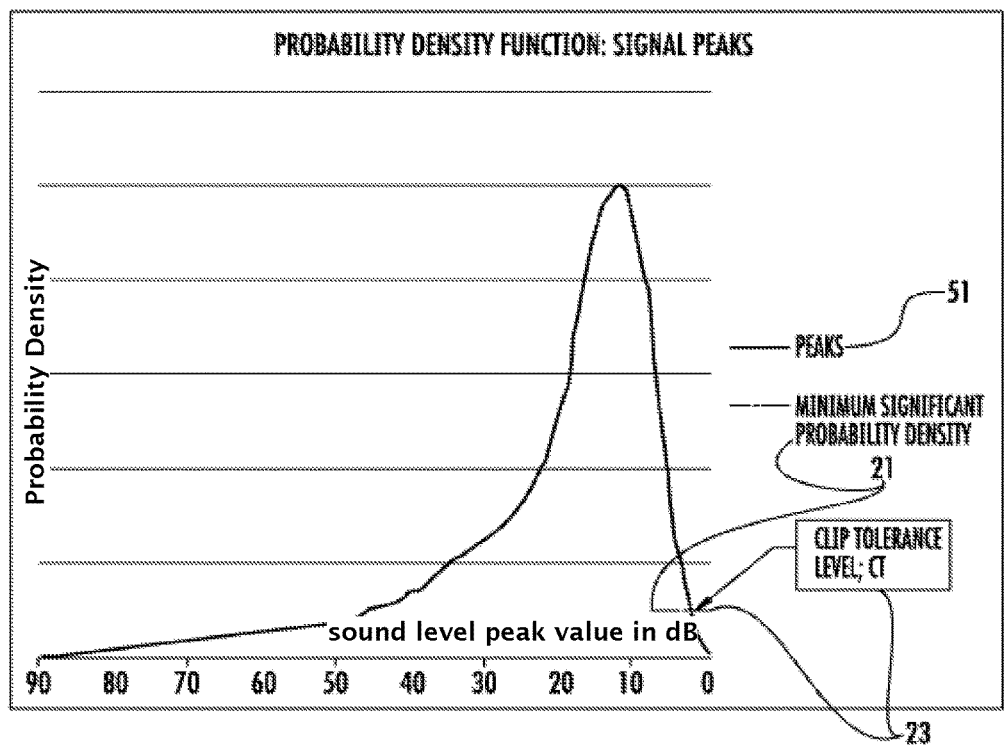
FIG. 9 shows an example of a Probability Density Function chart for peak voltages, highlighting the upper bound of the minimum significant probability and its relationship to Clip Tolerance.

FIG. 6 shows an r.m.s. Probability Density Function 118, specifically calling out its median level as the peak of the curve. The minimum significant Probability Density Function (upper) 21 defined as Clip Tolerance probability value 23 and minimum significant probability density (lower) 20 defined as Lower Limit Tolerance (LLT) value 219 are shown. The level at Clip Tolerance 23 obtained from the peak level Probability Density Function 51 of FIG. 9 is shown, and, as the peak level corresponding to the minimum significant probability density (upper) 21. The Crest Factor 22 is the difference between the Clip Tolerance Level (CT) 23 and the median r.m.s. level (peak of 118). The Lower Level Signal Tolerance (LLT) 219 is the intersection of the r.m.s. probability density 118 and the minimum significant probability density (lower) 20. The Diminuendo Factor 24 is the difference between the Median r.m.s. level peak (callout of 118) and the Lower Level Signal Tolerance (LLT) 219.

Figure 7:
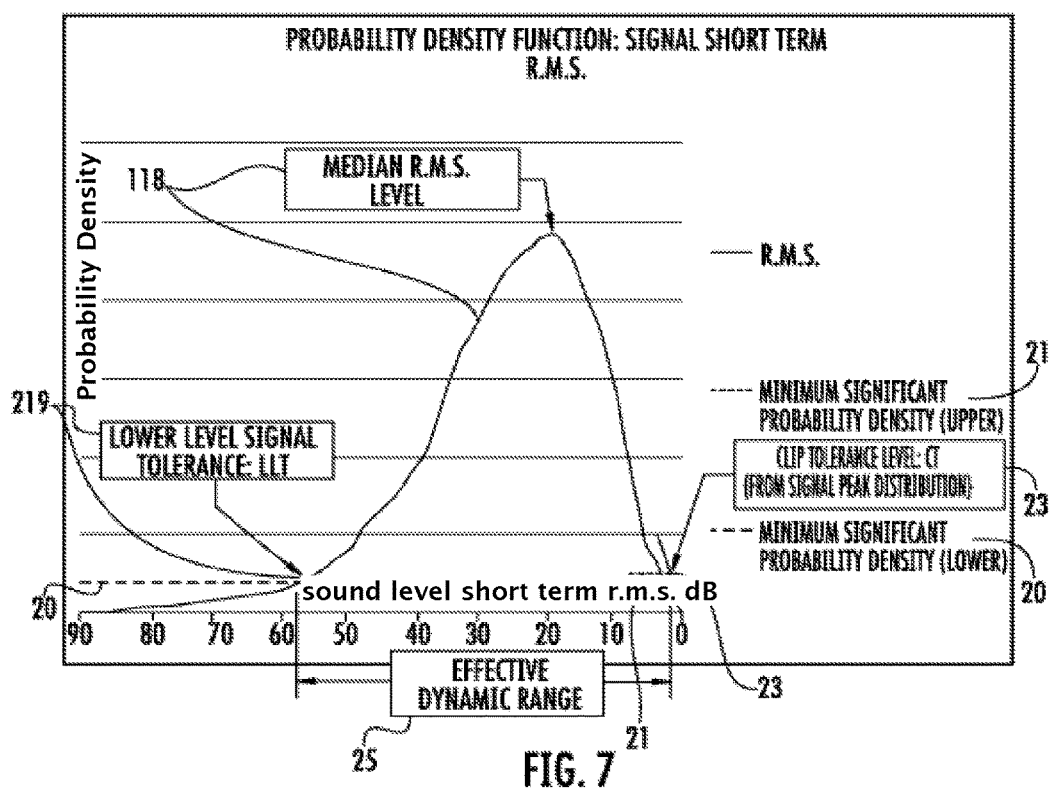
FIG. 7 shows a chart of Probability Density Function for r.m.s. voltage output values, taken over $LT_{r.m.s.}$, and its relationship to Effective Dynamic Range.

Comparing FIG. 6 to FIG. 7 shows that the Effective Dynamic Range 25 (FIG. 7) is equal to the Diminuendo Factor 24 plus Crest Factor 22 (FIG. 6).

Figure 8:
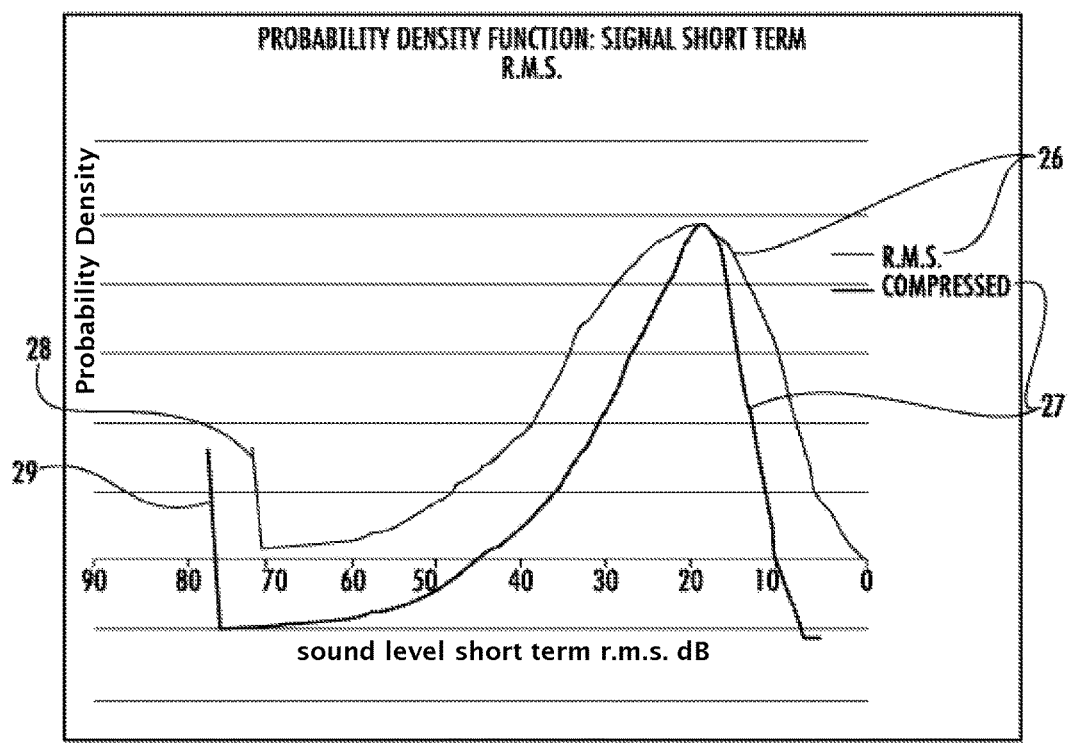
FIG. 8 shows a chart of Probability Density Function for the original r.m.s. and compressed voltage output values, taken over $LT_{r.m.s.}$, with the resultant curves normalized to the mean level to expose the changed nature of the distribution curve tails.
Figure 12:
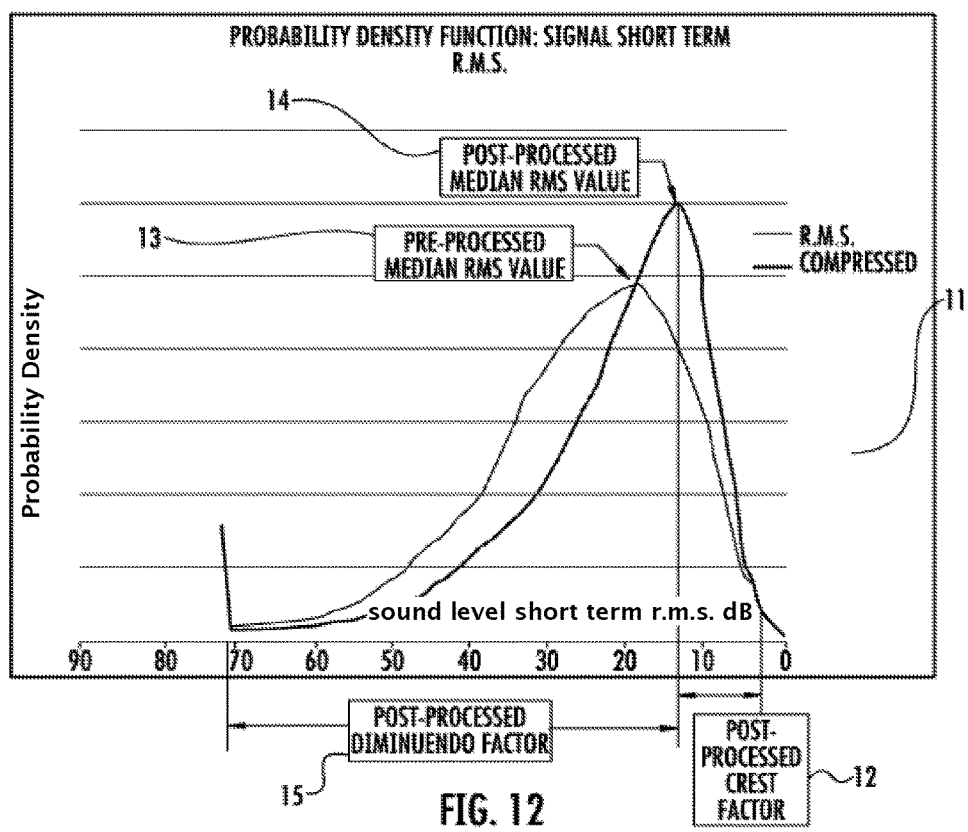
FIG. 12 shows a chart relating Probability Density Function of pre- and post-processed median r.m.s. values and their relationship to post-processed Diminuendo and Crest factors.

FIG. 8 shows the same curves as FIG. 12, being original signal r.m.s. Probability Density Function 26 compared to a compressed probability density function 27. In this chart, the curves have been normalized to the median level to visually highlight the characteristic of the tails 28, 29 of each curve in which the compressed curve tails show more kurtosis, i.e. steeper tails, than the original signal curve.

FIG. 9 shows an example Probability Density Function chart for signal peak levels in which the minimum significant probability density (upper) for highest level signal peaks considered statistically significant has been set 21. This Clip Tolerance 23 probability corresponds to the intersection of the peaks curve 51, and the minimum significant probability density 21.

Figure 10:
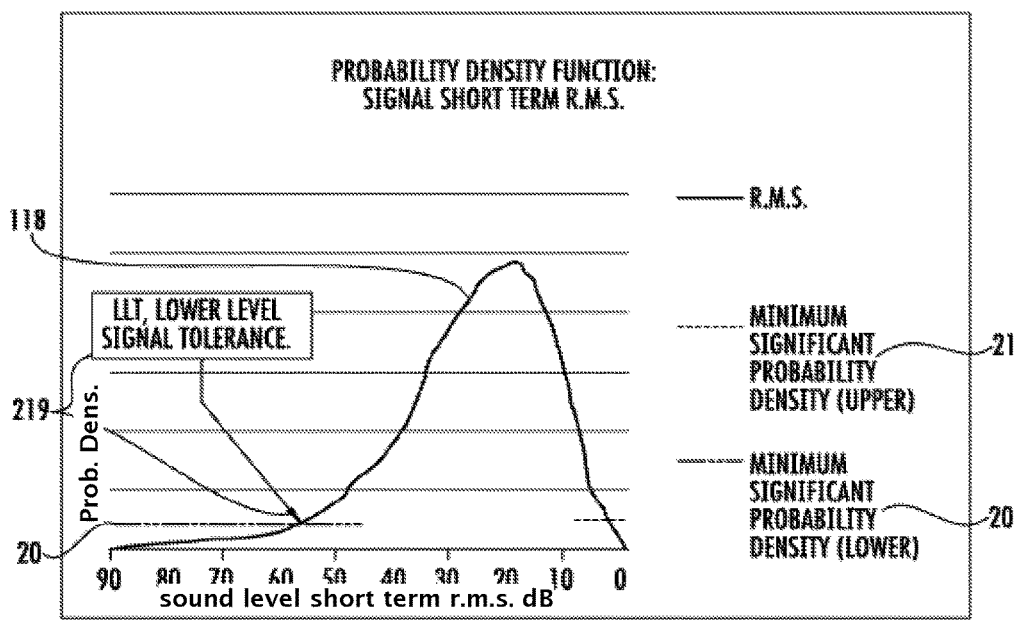
FIG. 10 shows an example of a Probability Density Function, highlighting the relationship between the lower level signal tolerance (LLT), and the lower bound for the minimum significant probability density.

FIG. 10 shows an example of a Probability Density Function for r.m.s. voltage value 118, using a $T_{rms}$ time window, highlighting the LLT 219 and the minimum significant probability density (lower) 20. The LLT 219 is the intersection of the lower portion fo the r.m.s. Probability Density Function 118 and the minimum significant probability density (lower) 20. The minimum significant probability density (upper) 21 is also shown for reference.

Figure 11:
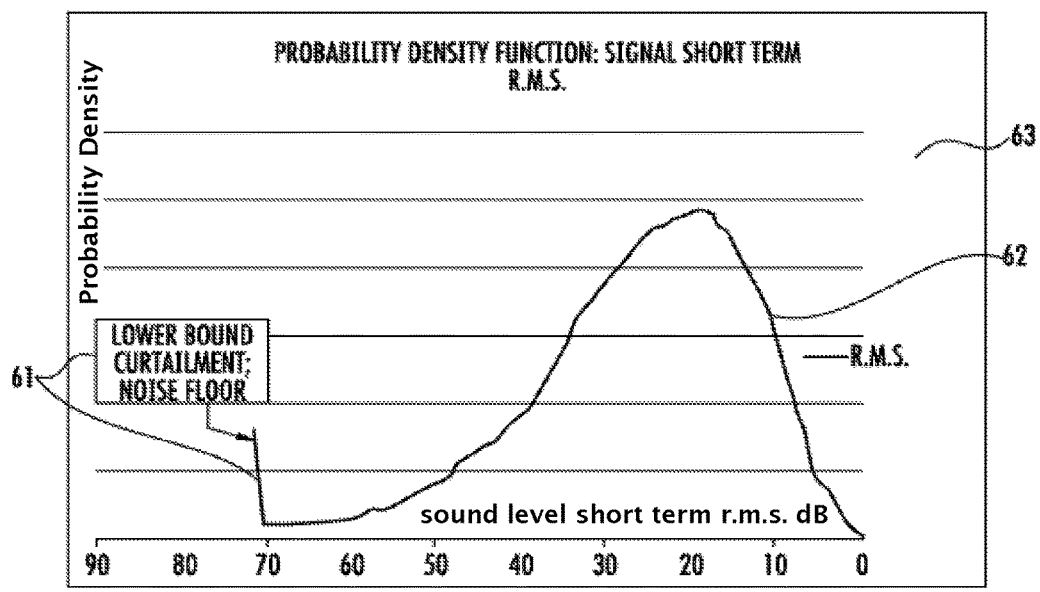
FIG. 11 shows a Probability Density Function chart for r.m.s. value or voltage, measured over $LT_{r.m.s.}$, showing lower bound curtailment caused by the noise floor.

FIG. 11 shows a curve 63 of a Probability Density Function 62 for the signal short term r.m.s, taken over time value $LT_{rms}$. The lower portion of the curve shows the curtailment of the lower bound at the noise floor 61.

FIG. 12 shows a comparison between pre- 13 and post-processed 14 Probability Density Functions 11. The relationship between the Post-processed Diminuendo Factor 15 and Post-processed Crest Factor 12 is apparent. Similarly the same quantities could be calculated for the Pre-processed values, as shown in FIG. 3.

I claim:

1. A quantitative evaluation method for use on a signal dynamics modifier device, comprising using a signal dynamics modifier device which modifies at least one input signal into at least one output signal;

measuring the at least one input signal and at least one output signal;

displaying the at least one input signal and at least one output signal;

using a software application, embodied on a non-transitory computer readable medium, for characterizing the effects of the signal dynamics modifier device on signal dynamic properties by using statistical analysis of digitized signal samples as time variant amplitude value data;

calculating, over selected time period, for both the at least one input signal and the at least one output signal, the probability density functions for both signal peaks and signal short term r.m.s. values; and comparing the characteristics of these two sets of probability density functions by calculating median r.m.s. value;

maximum peak value considered statistically significant by a user;

minimum r.m.s. value considered statistically significant by the user;

ratios of the aforementioned median, maximum and minimum values;

other statistical characteristics including standard deviation, skew and kurtosis; and composites of the above characteristics; and adjusting the signal dynamics modifier device, based on one or more of the calculations.

2. The quantitative evaluation method for used on a signal dynamics modifier device according to claim 1, wherein the the step of measuring the at least one input signal and at least one output signal is performed by a computer sound card which provides digitized signal in the form of contiguous time variant sample data for both the at least one input signal and at least one output signal to the software application.

3. The quantitative evaluation method for used on a signal dynamics modifier device according to claim 1, in which the software application is resident upon, and the statistical analysis is performed by a circuitry of a dedicated device capable of simultaneous evaluation of at least one input signal to the signal dynamics modifier device and at least one output signal from the signal dynamics modifier device.

4. The quantitative evaluation method for used on a signal dynamics modifier device according to claim 1, in which the statistical analysis and the software application are executed by a digital signal processing algorithm on a digital signal processing device, wherein the algorithm is embodied on a non-transitory computer readable medium, running on the digital signal processing device, and its associated circuitry.

5. The quantitative evaluation method for used on a signal dynamics modifier device described in claim 4, wherein the digital signal processing device is a processor of the signal dynamics modifier device.

6. The quantitative evaluation method for used on a signal dynamics modifier device according to claim 1, wherein the step of adjusting the signal dynamics modifier device further comprises allowing user selection and/or setting of clip tolerance, lower limit tolerance, crest factor, and diminuendo factor.

7. The quantitative evaluation method for used on a signal dynamics modifier device described in claim 1, wherein the step of adjusting the signal dynamics modifier device further comprises allowing user selection and/or setting of short term time window (Tr.m.s.), and long term time window (LTr.m.s).

8. The quantitative evaluation method for used on a signal dynamics modifier device according to claim 1, wherein the step of adjusting the signal dynamics modifier device further comprises dividing either or both of the input and output signals into multiple frequency bands, allowing for the simultaneous analyses and comparison.

9. The quantitative evaluation method for used on a signal dynamics modifier device according to claim 1, wherein the step of adjusting the signal dynamics modifier device further comprises supplying a negative feedback between the output of the signal dynamics modifier device and the input, to more closely meet the dynamics modification effect behavior desired by an end-user.

10. The quantitative evaluation method for used on a signal dynamics modifier device according to claim 1, in which the output signal is an acoustic signal from a loudspeaker system received at a measurement microphone which is passed from a measurement preamplifier to a post processed analysis allowing evaluation of the effects of power compression on signal dynamics in the acoustic domain.

11. The quantitative evaluation method for used on a signal dynamics modifier device according to claim 1, wherein the step of measuring the at least one input signal and at least one output signal is performed by an external signal interface which provides digitized signal in the form of contiguous time variant sample data for both the at least one input signal and at least one output signal to the software application.

* * * * *